(12) United States Patent
Kato et al.

(10) Patent No.: US 10,115,872 B2
(45) Date of Patent: Oct. 30, 2018

(54) LIGHT EMITTING DEVICE AND METHOD OF MANUFACTURING THE SAME

(71) Applicant: TOYODA GOSEI CO., LTD., Kiyosu-shi (JP)

(72) Inventors: Daisuke Kato, Kiyosu (JP); Tomohiro Miwa, Kiyosu (JP); Shigeo Takeda, Kiyosu (JP); Shota Shimonishi, Kiyosu (JP); Satomi Seki, Kiyosu (JP)

(73) Assignee: TOYODA GOSEI CO., LTD., Kiyosu-shi, Aichi-ken (JP)

( * ) Notice: Subject to any disclaimer, the term of this patent is extended or adjusted under 35 U.S.C. 154(b) by 0 days.

(21) Appl. No.: 15/643,369

(22) Filed: Jul. 6, 2017

(65) Prior Publication Data

US 2018/0090646 A1   Mar. 29, 2018

(30) Foreign Application Priority Data

Sep. 29, 2016   (JP) .................. 2016-191473

(51) Int. Cl.
*H01L 33/08* (2010.01)
*H01L 33/50* (2010.01)
*H01L 33/38* (2010.01)

(52) U.S. Cl.
CPC ............ *H01L 33/504* (2013.01); *H01L 33/08* (2013.01); *H01L 33/38* (2013.01); *H01L 2933/0041* (2013.01)

(58) Field of Classification Search
CPC .. H01L 33/08; H01L 33/504; H01L 2933/504
See application file for complete search history.

(56) References Cited

U.S. PATENT DOCUMENTS

| 8,558,476 B2* | 10/2013 | Cho ................. G02F 1/133603 315/185 R |
| 8,664,672 B2* | 3/2014 | Ogihara ................... G09F 9/33 257/89 |
| 8,847,478 B2* | 9/2014 | Medendorp, Jr. .... C09K 11/586 313/501 |
| 9,109,762 B2 | 8/2015 | Yamakawa et al. |

(Continued)

FOREIGN PATENT DOCUMENTS

| JP | 2013-041876 A | 2/2013 |
| JP | WO2012/108065 A1 | 7/2014 |

(Continued)

*Primary Examiner* — Phuc Dang
(74) *Attorney, Agent, or Firm* — McGinn IP Law Group, PLLC (57) ABSTRACT

A light emitting device includes a first light emitting element that outputs a first emitted light having a first peak wavelength, a second light emitting element that outputs a second emitted light having a second peak wavelength, and a phosphor layer including a plurality of phosphors, which is disposed on the first and second light emitting elements. The phosphor layer receives the first and second emitted light and outputs a plurality of emitted light based on the plurality of phosphors so as to form a first synthesized emission spectrum. The second light emitting element includes an emission spectrum to reduce a depth of a deepest dip of at least one dip in a second synthesized emission spectrum that is formed by removing an emission spectrum of the second emitted light from the first synthesized emission spectrum.

19 Claims, 5 Drawing Sheets

(56) References Cited

U.S. PATENT DOCUMENTS

| | | | |
|---|---|---|---|
| 9,112,120 B2 | 8/2015 | Yamakawa et al. | |
| 9,305,903 B2 | 4/2016 | Terakami et al. | |
| 2013/0307011 A1 | 11/2013 | Yamakawa et al. | |
| 2014/0036499 A1 | 2/2014 | Yamakawa et al. | |
| 2015/0049459 A1* | 2/2015 | Peeters | H01L 25/0753 362/84 |
| 2015/0076534 A1 | 3/2015 | Terakami et al. | |
| 2015/0116381 A1* | 4/2015 | Kim | G09G 3/3413 345/691 |

FOREIGN PATENT DOCUMENTS

| | | | |
|---|---|---|---|
| JP | WO2012/144087 A1 | 7/2014 | |
| JP | 2015-084397 A | 4/2015 | |

* cited by examiner

LIGHT EMITTING DEVICE AND METHOD OF MANUFACTURING THE SAME

The present application is based on Japanese patent application No. 2016-191473 filed on Sep. 29, 2016, the entire contents of which are incorporated herein by reference.

BACKGROUND OF THE INVENTION

1. Field of the Invention

This invention relates to a light emitting device and a method of manufacturing the light emitting device.

2. Description of the Related Art

A light emitting device is known which comprises an LED (Light Emitting Diode) and a phosphor, and outputs white light (see e.g. WO2012/108065 and WO2012/144087). The light emitting device provides a white light spectrum as a synthesized emission spectrum of a spectrum from the LED and a spectrum from the phosphor.

SUMMARY OF THE INVENTION

Phosphors have a characteristic that absorption spectrum thereof is separated in wavelength region from emission spectrum thereof. Thus, a light emitting element having an emission wavelength separated from the emission spectrum of the phosphor must be used as an excitation light source so as to increase an excitation light absorbing efficiency.

Along with this, in a bluish white spectrum that is the synthesized emission spectrum with the spectrum from the light emitting element and the spectrum from the phosphor and has particularly high color temperature such as daylight color, there exists a deep dip between the emission spectrum of the light emitting element and the emission spectrum of the phosphor. The deep dip prevents the emission spectrum of the light emitting device from coming close to the spectrum of the sunlight (or natural light).

It is an object of the invention to provide a light emitting device that has an emission spectrum brought close to the sunlight by reducing the depth of the dip of the emission spectrum formed by synthesizing light output from the light emitting element and light output from the phosphor layer, as well as a method of manufacturing the light emitting device.

According to an embodiment of the invention, a light emitting device defined by [1] to [7] below is provided.

[1] A light emitting device, comprising:
a first light emitting element that outputs a first emitted light having a first peak wavelength;
a second light emitting element that outputs a second emitted light having a second peak wavelength; and
a phosphor layer including a plurality of phosphors, which is disposed on the first and second light emitting elements,
wherein the phosphor layer receives the first and second emitted light and outputs a plurality of emitted light based on the plurality of phosphors so as to form a first synthesized emission spectrum that is distributed at a longer wavelength side than the first peak wavelength of the first emitted light and includes an emission spectrum formed by the first and second emitted light, and
wherein the second light emitting element comprises an emission spectrum to reduce a depth of a deepest dip of at least one dip in a second synthesized emission spectrum that is formed by removing an emission spectrum of the second emitted light from the first synthesized emission spectrum.

[2] The light emitting device according to [1], wherein the emission spectrum of the second light emitting element locates the second peak wavelength between both side peak wavelengths by which the deepest dip in the second synthesized emission spectrum is defined.

[3] The light emitting device according to [1] or [2], wherein the second peak wavelength of the second light emitting element comprises a wavelength that falls within 5 nm from a bottom wavelength of the deepest dip.

[4] The light emitting device according to any one of [1] to [3], wherein the first and second light emitting elements each comprises a plurality of first and second light emitting elements, and
wherein the plurality of first and second light emitting elements are disposed in a form of a lattice.

[5] The light emitting device according to any one of [1] to [4], wherein the plurality of second light emitting elements are different in the second peak wavelength.

[6] The light emitting device according to any one of [1] to [5], wherein the phosphor layer comprises a first phosphor layer that is disposed on the first light emitting element and includes the plurality of phosphors at a predetermined density, and a second phosphor layer that is disposed on the second light emitting element and include the plurality of phosphors at a density that is lower than the predetermined density.

[7] The light emitting device according to any one of [1] to [6], wherein the first peak wavelength of the first light emitting element is shorter than the second peak wavelength of the second light emitting element, and
wherein the phosphor layer comprises a third phosphor layer that is disposed on the first light emitting element and includes a phosphor to output a short wavelength emitted light of the plurality of phosphors, and a fourth phosphor layer that is disposed on the second light emitting element and includes a phosphor to output a long wavelength emitted light of the plurality of phosphors.

According to another embodiment of the invention, a method of manufacturing a light emitting device defined by [8] and [9] below is provided.

[8] A method of manufacturing a light emitting device according to any one of [1] to [7], comprising forming the phosphor layer or the first to fourth phosphor layer by coating the plurality of phosphors on the first and second light emitting elements or the plurality of first and second light emitting elements.

[9] The method according to [8], wherein the coating is conducted by printing.

Effects of the Invention

According to an embodiment of the invention, a light emitting device can be provided that has an emission spectrum brought close to the sunlight by reducing the depth of the dip of the emission spectrum formed by synthesizing light output from the light emitting element and light output from the phosphor layer, as well as a method of manufacturing the light emitting device.

BRIEF DESCRIPTION OF THE DRAWINGS

Next, the present invention will be explained in conjunction with appended drawings, wherein.

DETAILED DESCRIPTION OF THE PREFERRED EMBODIMENTS

First Embodiment

Figure 1:
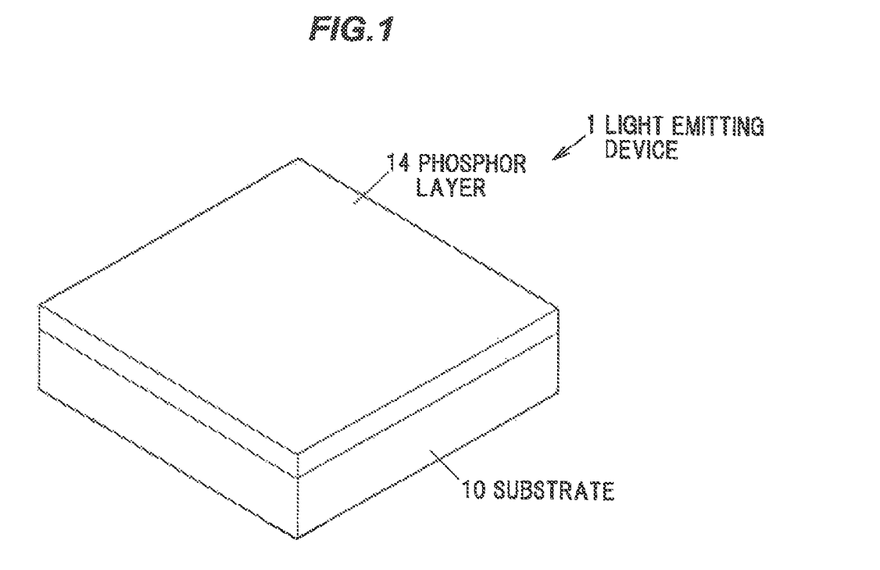
FIG. 1 is a perspective view showing a light emitting device according to the first embodiment.
Figure 2A:
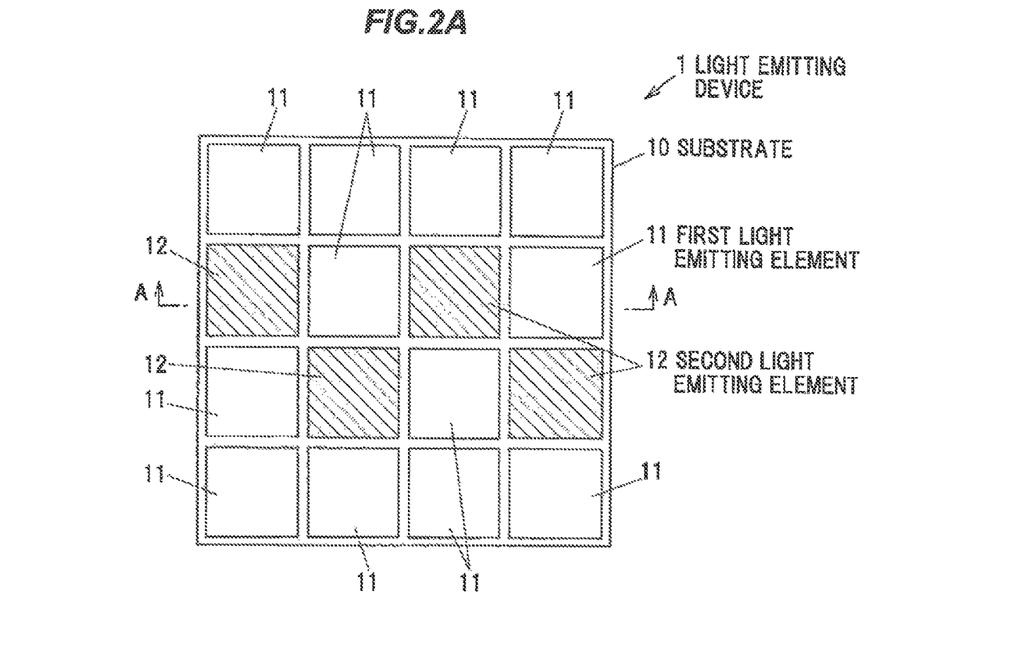
FIG. 2A is a top view showing the light emitting device according to the first embodiment.
Figure 2B:
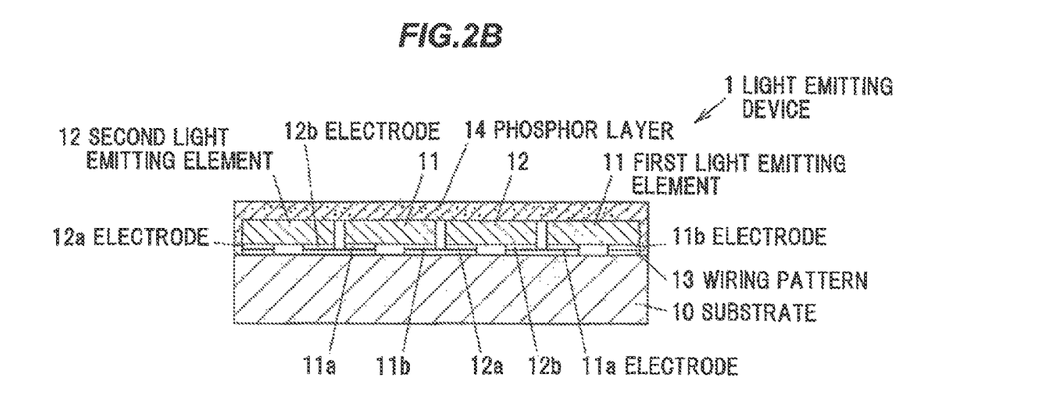
FIG. 2B is a longitudinal sectional view showing the light emitting device cut along the line A-A in FIG. 2A.

FIG. 1 is a perspective view showing a light emitting device 1 according to the first embodiment. FIG. 2A is a plan view showing the light emitting device 1, which omits the phosphor layer 14. FIG. 2B is a longitudinal sectional view showing the light emitting device 1 cut along the line A-A in FIG. 2A.

The light emitting device 1 is provided with a substrate 10, a plurality of first light emitting elements 11 and a plurality of second light emitting elements 12 disposed on the substrate 10, and a phosphor layer 14 including a plurality of phosphors, which are disposed on the plurality of first and second light emitting elements 11, 12.

The plurality of first light emitting elements 11 and the plurality of second light emitting elements 12 are disposed so as to be latticework and partly form a checkboard pattern. The first and second light emitting elements 11, 12 may be individually composed of at least one light emitting element. And a form of the arrangement or layout is changed in response to product design.

The first light emitting element 11 outputs an emitted light of which peak wavelength is within a wavelength region corresponding to the region between the blue and the violet. The second light emitting element 12 outputs an emitted light of which peak wavelength is within the wavelength region corresponding to the region between the blue and the violet, and is longer than the peak wavelength of the emitted light output from the first light emitting element 11. In this case, it is preferable that an emission color of the first light emitting element 11 approaches to an emission color of the second light emitting element 12 since the difference between the peak wavelengths of the emitted light output from the first and second light emitting elements 11, 12 is within 30 nm. Furthermore, it is the most preferable that the difference between the peak wavelengths is within a range of 15 to 20 nm.

The phosphor layer 14 receives the emitted light output from the first and second light emitting elements 11, 12 and outputs a plurality of wavelength conversion light caused by a plurality of phosphors, which forms an emission spectrum of the light emitting device 1 including an emission spectrum formed by the emitted light output from the first and second light emitting elements 11, 12, which is distributed in a long wavelength side longer than the peak wavelength of the emitted light output from the first light emitting element 11.

The second light emitting element 12 is used to shallow a depth of the deepest dip in at least one dip in the emission spectrum formed by the emitted light output from the first light emitting element 11 by removing the emitted light output from the second light emitting element 12 from the emission spectrum of the light emitting device 1 and the plurality of wavelength conversion light output from the phosphor layer 14, and approximate the emission spectrum of the light emitting device 1 to the emission spectrum of the sunlight.

Therefore, the second light emitting element 12 has a peak wavelength in the range between the two peak wavelengths (the wavelength at the top of the peak) that forms the deepest dip in the synthesized emission spectrum formed by the emitted light output from the first light emitting element 11 and the plurality of wavelength conversion light output from the phosphor layer 14. In the peak wavelength within the range between the two peak wavelengths, it is preferable that a gap from the wavelength at the bottom of the deepest dip in the synthesized emission spectrum formed by the emitted light output from the first light emitting element 11 and the plurality of wavelength conversion light output from the phosphor layer 14 is not more than 5 nm.

For example, the first and second light emitting elements 11, 12 are LED chips comprising a chip substrate and a crystalline layer including a light emitting layer and cladding layer to sandwich the light emitting layer. The LED chip may be a Face-up type that the crystalline layer faces upward or a Face-down type that the crystalline layer faces downward. Also, the first and second light emitting elements 11, 12 may be light emitting elements except the LED chips such as laser diodes.

In FIGS. 2A, 2B, for example, the substrate 10 is a wiring substrate or a lead frame inserted substrate. And a wiring pattern 13 to connect electrodes 11a, 11b for the first light emitting elements 11 and electrodes 12a, 12b for the second light emitting element 12 is formed on an element mounting surface.

The phosphor layer 14 is in common with the first and second light emitting elements 11, 12. For example, the phosphor layer 14 includes a plurality of phosphors composed of phosphor particles. The phosphor layer 14 is formed by coating, for example, by printing, and hardening a hardening resin component in which the plurality of phosphor particles is spread on the emission surface of the first and second light emitting elements 11, 12. For example, the plurality of phosphors are blue phosphor, blue-green phosphor, green phosphor, and red phosphor, which are excited by a part of the emitted light output from the first and second light emitting elements 11, 12 and individually emit blue wavelength conversion light, blue-green wavelength conversion light, green wavelength conversion light, and red wavelength conversion light. Meanwhile the phosphor is not limited thereto. The phosphor may form the white light from the emitted light of the first and second light emitting elements 11, 12.

EXAMPLES

Next, examples of the present invention will be explained below.

Example 1

As shown in FIGS. 2A, 2B, twelve first light emitting elements 11 and four second light emitting elements 12 are mounted on a wiring substrate arranged as the substrate 10 in an array pattern that is latticework and partly forms a checkboard pattern with the first light emitting element 11 and the second light emitting element 12. Next, the electrodes 11a, 11b of the first light emitting element 11 and the electrodes 12a, 12b of the second light emitting element 12 are connected to the wiring pattern 13 on the substrate 10.

Next, as shown in FIG. 2B, the light emitting device 1 is made by forming the phosphor layer 14 on the first light emitting element 11 and the second light emitting element 12 by coating, for example, by printing and hardening the hardening resin component that the plurality of phosphor particles including the blue phosphor composed of $(Sr, Ca, Ba)_{10}(PO_4)C_{12}$:Eu, the blue-green phosphor composed of $(Sr, Ca, Ba)_{10}(PO_4)Cl_2$:Eu, the green phosphor composed of $(Si, Al)_6(O,N)_8$:Eu$^{2+}$, and the red phosphor composed of $CuAlSiN_3$:Eu$^{2+}$ are spread in an epoxy resin etc.

In this case, a violet LED that outputs an emitted light of which peak wavelength is 405 nm is used as the first light emitting element 11 and a blue-violet LED of which peak wavelength is 420 nm is used as the second light emitting element 12.

Figure 3A:
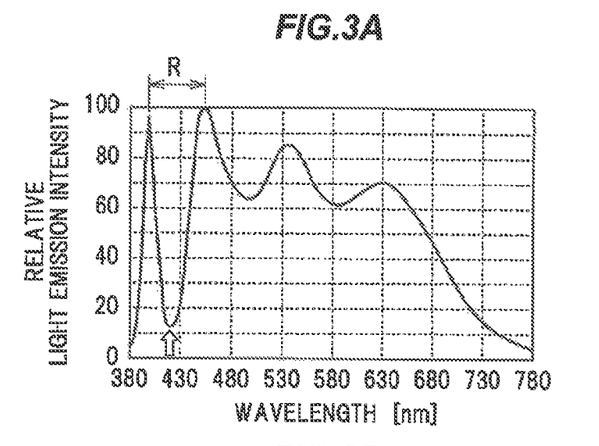
FIG. 3A is a graph showing an example of a synthesized emission spectrum with an emission spectrum from a first light emitting element of the light emitting device according to the example 1 and an emission spectrum from a phosphor layer.

FIG. 3A shows the synthesized emission spectrum in forming the white light by outputting the emitted light from the first light emitting element 11 only and outputting the blue light, the blue-green light, the green light, and the red light from the phosphor layer 14 by exciting the blue phosphor, the blue-green phosphor, the green phosphor, and the red phosphor by the part of the emitted light. FIG. 3A shows that the wavelength at the bottom of the deepest dip (shown by the allow) in the emission spectrum formed by the emitted light output from the first light emitting element 11 and the wavelength conversion light formed by the blue light, the blue-green light, the green light, and the red light output from the phosphor layer 14 is about 420 nm. Also, in the two peaks of the emission spectrums that form the deepest dip, the peak wavelength in a short wavelength side (the peak of the emission spectrum of the emitted light output from the first light emitting element 11) is about 398 nm and the peak wavelength in the long wavelength side (the peak of the emission spectrum of the plurality of wavelength conversion light output from the phosphor layer 14) is about 453 nm.

Figure 3B:
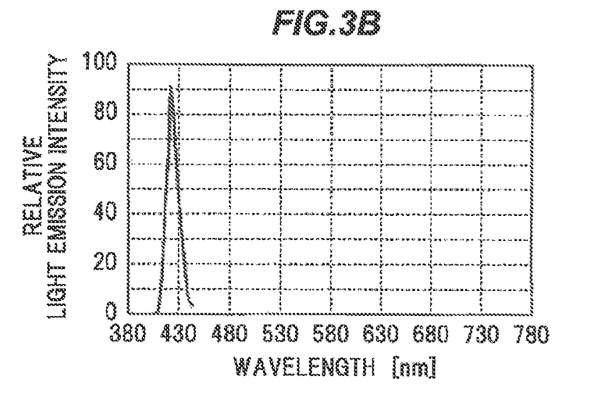
FIG. 3B is a graph showing an example of an emission spectrum of a second light emitting element of the light emitting device according to the example 1.

FIG. 3B shows the emission spectrum of the emitted light output from the second light emitting element 12. As known from FIG. 3B, the peak wavelength of the second light emitting element 12 is within the range R that is more than 398 nm and less than 453 nm in the emission spectrum shown in FIG. 3A. And the gap from the bottom of the deepest dip that is 420 nm is within 5 nm. That is, the peak wavelength of the second light emitting element 12 is not less than 415 nm and not more than 425 nm.

Figure 3C:
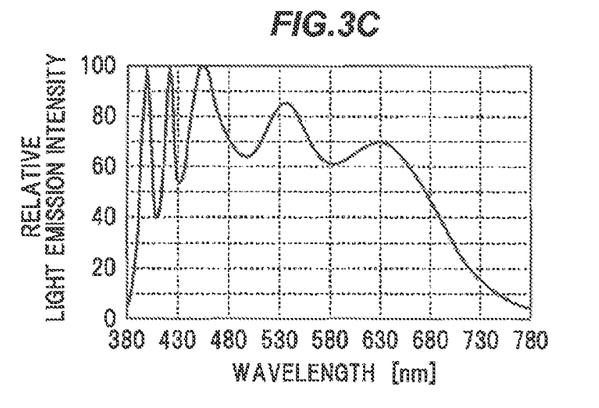
FIG. 3C is a graph showing an example of an emission spectrum of the light emitting device according to the example 1.

FIG. 3C shows the emission spectrum in forming the white light by outputting the emitted light from the first and second light emitting elements 11, 12 and the wavelength conversion light with the blue light, the blue-green light, the green light, and the red light from the phosphor layer 14 by exciting the blue phosphor, the blue-green phosphor, the green phosphor, and the red phosphor by the part of the emitted light. That is, FIG. 3C shows the emission spectrum of the light emitting device 1. As known from FIG. 3C, in the emission spectrum of the light emitting device 1, the wavelength region from 389 to 440 nm is formed by the emission spectrum of the emitted light output from the first and second light emitting elements 11, 12 and the wavelength region from 440 to 700 nm is formed by the emission spectrum of the wavelength conversion light formed by the blue light, the blue-green light, the green light, and the red light output from the phosphor layer 14. Therefore, the depth of the deepest dip of the emission spectrum shown in FIG. 3A shallows significantly and the emission spectrum similar to the sunlight that is as flat as possible can be obtained.

Example 2

The example 2 has generally same configuration as the light emitting device 1 in the example 1 except the difference in the peak wavelengths of the first and second light emitting element 11, 12, and the phosphor in the phosphor layer 14. Thus, the explanation except the difference from the example 1 is omitted.

In this example, the blue LED that outputs the emitted light of which peak wavelength is 450 nm is used as the first light emitting element 11 and the blue-green LED that outputs the emitted light of which peak wavelength is 475 nm is used as the second light emitting element 12.

Moreover, the green phosphor composed of $Lu_{3}Al_5O_{12}$:Ce$^{3+}$ or $Y_{3}Al_5O_{12}$:Ce$^{3+}$ and the red phosphor composed of $CaAlSiN_3$:Eu$^{2+}$ are applied as the phosphor particles that are contained in the phosphor layer 14.

Figure 4A:
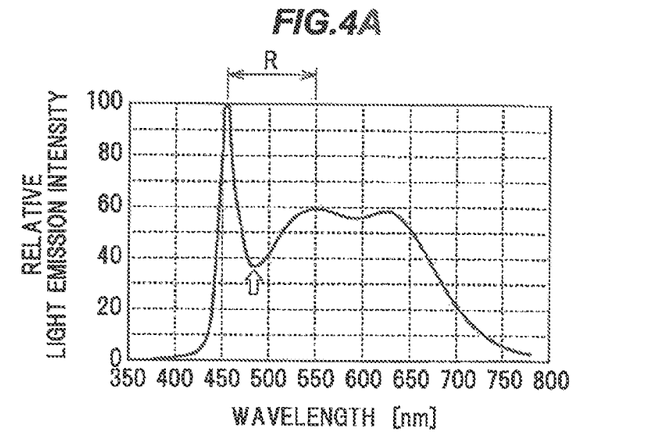
FIG. 4A is a graph showing an example of a synthesized emission spectrum with the emission spectrum from the first light emitting element and the emission spectrum from the phosphor layer in the example 2.

FIG. 4A shows the synthesized emission spectrum in forming the white light by outputting the emitted light from the first light emitting element 11 only and outputting the green light and the red light from the phosphor layer 14 by exciting the green phosphor and the red phosphor by the part of the emitted light. FIG. 4A shows that the wavelength at the bottom of the deepest dip (shown by the allow) in the emission spectrum formed by the emitted light output from the first light emitting element 11 and the wavelength conversion light formed by the green light and the red light output from the phosphor layer 14 is about 482 nm. Also, in the two peaks of the emission spectrums that form the deepest dip, the peak wavelength in the short wavelength side (the peak of the emission spectrum of the emitted light output from the first light emitting element 11) is about 452 nm and the peak wavelength in the long wavelength side (the peak of the emission spectrum of the plurality of wavelength conversion light output from the phosphor layer 14) is about 547 nm.

Figure 4B:
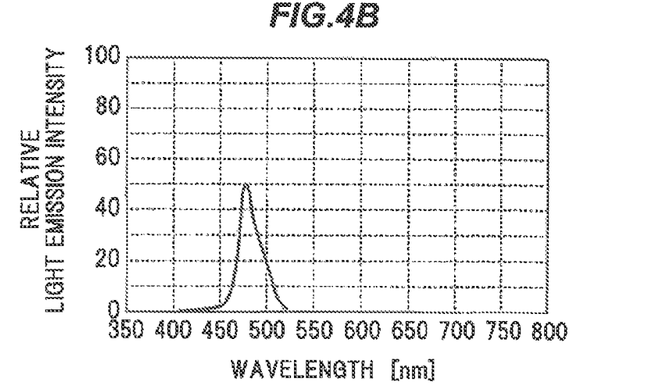
FIG. 4B is a graph showing an example of an emission spectrum of the second light emitting element of the light emitting device in modification according to the example 2.

FIG. 4B shows the emission spectrum of the emitted light output from the second light emitting element 12. As known from FIG. 4B, the peak wavelength of the second light emitting element 12 is within the range R that is more than 452 nm and less than 547 nm in the emission spectrum shown in FIG. 4A. And the gap from the bottom of the deepest dip that is 482 nm is within 5 nm. That is, the peak wavelength of the second light emitting element 12 is not less than 477 nm and not more than 487 nm.

Figure 4C:
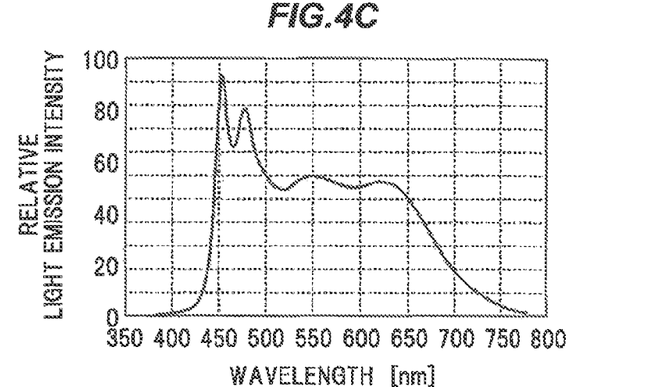
FIG. 4C is a graph showing an example of an emission spectrum of the light emitting device in the modification according to the example 2.

FIG. 4C shows the emission spectrum in forming the white light by outputting the emitted light from the first and second light emitting elements 11, 12 and the wavelength conversion light with the green light and the red light from the phosphor layer 14 by exciting the green phosphor and the red phosphor by the part of the emitted light. That is, FIG. 4C shows the emission spectrum of the light emitting device 1. As known from FIG. 4C, the depth of the deepest dip of the emission spectrum shown in FIG. 4A shallows significantly and the emission spectrum similar to the sunlight that is as flat as possible can be obtained.

Second Embodiment

Figure 5:
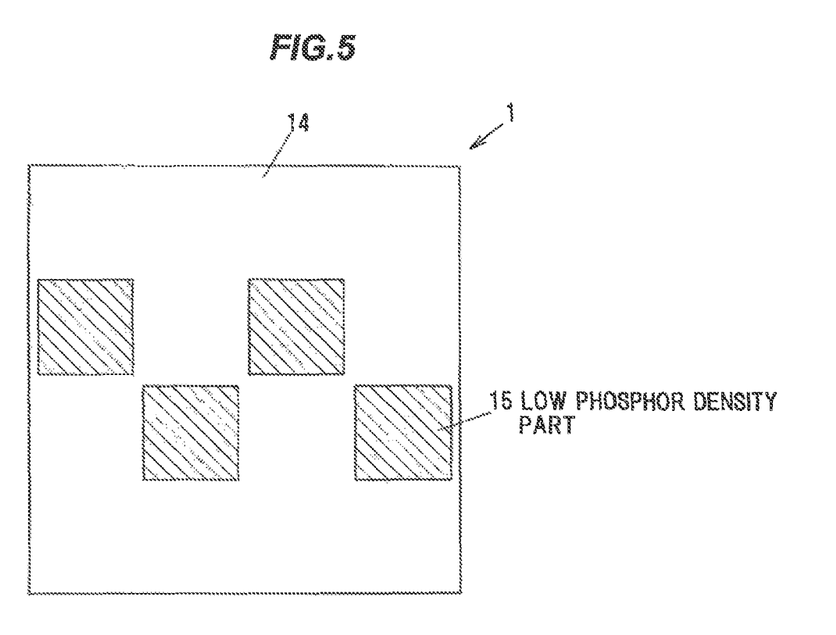
FIG. 5 is a plan view showing the light emitting device according to the second embodiment.

FIG. 5 is a plan view showing the light emitting device 1 according to the second embodiment. The light emitting device 1 has the generally same configuration as the light emitting device 1 in the first embodiment except the difference in the configuration of the phosphor layer 14. Thus, the explanation except the difference from the first embodiment is omitted.

The phosphor layer 14 of the light emitting device 1 according to the second embodiment is formed so as to have a low phosphor density part 15 that is disposed on the second light emitting element 12, which has a phosphor density lower than the phosphor density in a part located on the first light emitting element 11.

According to the configuration of the second embodiment, an absorption of the emitted light output from the second light emitting element 12 caused by the phosphor can be reduced, and the emission wavelength and the light emitting intensity of the second light emitting element 12 to shallow the deepest dip described above can be set easily.

Third Embodiment

Figure 6:
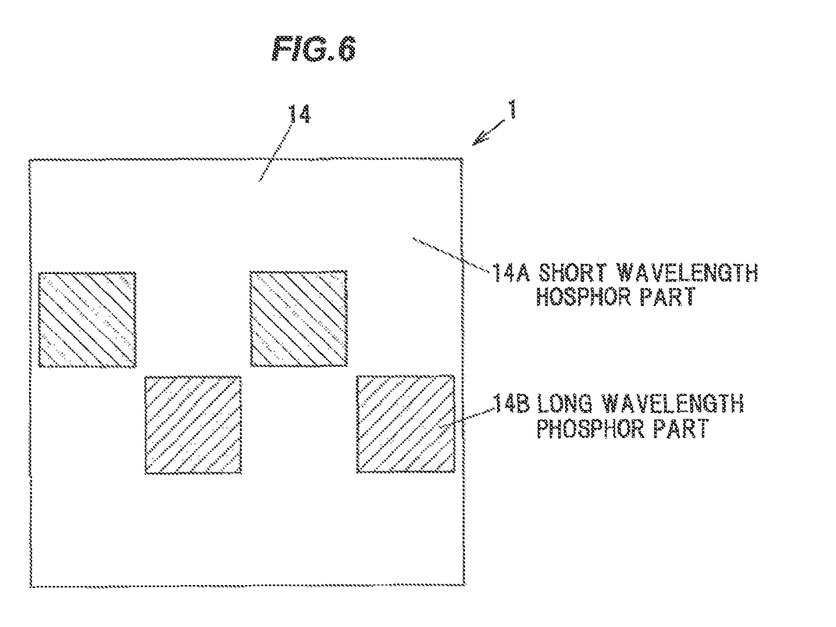
FIG. 6 is a plan view showing the light emitting device according to the third embodiment.

FIG. 6 is a plan view showing the light emitting device 1 according to the third embodiment. The light emitting device 1 has the generally same configuration as the light emitting device 1 in the first embodiment except the difference in the configuration of the phosphor layer 14. Thus, the explanation except the difference from the first embodiment is omitted.

The phosphor layer 14 of the light emitting device 1 according to the third embodiment is composed of a short wavelength phosphor part 14A disposed on the first light emitting element 11, which includes a short wavelength phosphor such as the blue phosphor and the blue-green phosphor and a long wavelength phosphor part 14B disposed on the second light emitting element 12, which includes a long wavelength phosphor such as the green phosphor and the red phosphor.

According to the configuration of the third embodiment, the absorption of the emitted light output from the second light emitting element 12 caused by the short wavelength phosphor can be reduced, and the emission wavelength and the light emitting intensity of the second light emitting element 12 to shallow the above deepest dip can be set easily.

Advantageous Effects of the Embodiments

According to the above embodiments, the emission spectrum close to the sunlight can be obtained by applying the second light emitting element 12 to reduce the depth of the deepest dip in the emission spectrum formed by the emitted light output from the first light emitting element 11 and the plurality of wavelength conversion light output from the phosphor layer 14.

Although the embodiments have been described, the invention is not intended to be limited to the embodiments. The various kinds of modifications can be implemented without departing from the gist of the invention.

Also, the claimed invention is not intended to be limited to the embodiments. Further, it should be noted that all combinations of the features described in the embodiments and the Examples are not necessary to solve the problems of the invention.

What is claimed is:

1. A light emitting device, comprising:
a first light emitting element that outputs a first emitted light having a first peak wavelength;
a second light emitting element that outputs a second emitted light having a second peak wavelength; and
a phosphor layer including a plurality of phosphors, which is disposed on the first and second light emitting elements,
wherein the phosphor layer receives the first and second emitted light and outputs a plurality of emitted light based on the plurality of phosphors so as to form a first synthesized emission spectrum that is distributed at a longer wavelength side than the first peak wavelength of the first emitted light and includes an emission spectrum formed by the first and second emitted light, and
wherein the second light emitting element comprises an emission spectrum to reduce a depth of a deepest dip of at least one dip in a second synthesized emission spectrum that is formed by removing an emission spectrum of the second emitted light from the first synthesized emission spectrum.

2. The light emitting device according to claim 1, wherein the second peak wavelength is located between both side peak wavelengths by which the deepest dip in the second synthesized emission spectrum is defined.

3. The light emitting device according to claim 1, wherein the second peak wavelength of the second light emitting element comprises a wavelength that falls within 5 nm from a bottom wavelength of the deepest dip.

4. The light emitting device according to claim 1, wherein the first and second light emitting elements each comprises a plurality of first and second light emitting elements, and
wherein the plurality of first and second light emitting elements are disposed in a form of a lattice.

5. The light emitting device according to claim 4, wherein the plurality of second light emitting elements are different in the second peak wavelength.

6. The light emitting device according to claim 1, wherein the phosphor layer comprises a first phosphor layer that is disposed on the first light emitting element and includes the plurality of phosphors at a predetermined density, and a second phosphor layer that is disposed on the second light emitting element and include the plurality of phosphors at a density that is lower than the predetermined density.

7. The light emitting device according to claim 6, wherein the first peak wavelength of the first light emitting element is shorter than the second peak wavelength of the second light emitting element, and
wherein the phosphor layer comprises a third phosphor layer that is disposed on the first light emitting element and includes a phosphor to output a short wavelength emitted light of the plurality of phosphors, and a fourth phosphor layer that is disposed on the second light emitting element and includes a phosphor to output a long wavelength emitted light of the plurality of phosphors.

8. A method of manufacturing a light emitting device according to claim 1, comprising forming the phosphor layer by coating the plurality of phosphors on the first and second light emitting elements.

9. The method according to claim 8, wherein the coating is conducted by printing.

10. The light emitting device according to claim 1, wherein the phosphor layer is formed on an upper surface and side surface of the first and second light emitting elements.

11. The light emitting device according to claim 1, wherein the first peak wavelength is within a wavelength region between blue light and violet light.

12. The light emitting device according to claim 11, wherein the second peak wavelength is within a wavelength region between blue light and violet light, and is longer than the first peak wavelength.

13. The light emitting device according to claim 1, wherein the first peak wavelength is less than the second peak wavelength, a difference between the first and second peak wavelengths being no greater than 30 nm.

14. The light emitting device according to claim 1, wherein the plurality of phosphors comprises at least one of:
  a blue phosphor which is excited by a part of the first and second emitted light to emit blue wavelength conversion light;
  a blue-green phosphor which is excited by a part of the first and second emitted light to emit blue-green wavelength conversion light;
  a green phosphor which is excited by a part of the first and second emitted light to emit green wavelength conversion light; and
  a red phosphor which is excited by a part of the first and second emitted light to emit red wavelength conversion light.

15. The light emitting device according to claim 1, wherein the phosphor layer comprises a resin layer including a plurality of phosphor particles.

16. The light emitting device according to claim 1, wherein the first light emitting element comprises a plurality of first light emitting elements, and the second light emitting element comprises a plurality of second light emitting elements, and
  wherein a number of the first light emitting elements is greater than a number of the second light emitting elements.

17. The light emitting device according to claim 1, further comprising:
  a substrate, the first and second light emitting elements being formed on the substrate,
  wherein the substrate comprises one of a wiring substrate and a lead frame inserted substrate.

18. The light emitting device according to claim 1, further comprising:
  a wiring pattern formed on an element mounting surface of the substrate, the wiring pattern contacting electrodes of the first and second light emitting elements.

19. A light emitting device, comprising:
  a wiring pattern formed on an element mounting surface of a substrate,
  a plurality of first light emitting elements formed on the wiring pattern and outputting a first emitted light having a first peak wavelength;
  a plurality of second light emitting elements formed on the wiring pattern so as to form an array with the plurality of first light emitting elements, and outputting a second emitted light having a second peak wavelength greater than the first peak wavelength; and
  a phosphor layer formed on an upper surface and side surface of the first and second light emitting elements, and including a plurality of phosphors that convert the first and second emitted lights to form a first synthesized emission spectrum that is distributed over wavelengths greater than the first peak wavelength and includes an emission spectrum formed by the first and second emitted light,
  wherein the second emitted light comprises an emission spectrum to reduce a depth of a dip in a second synthesized emission spectrum formed by removing an emission spectrum of the second emitted light from the first synthesized emission spectrum.

* * * * *